(12) United States Patent
Jiang et al.

(10) Patent No.: US 11,255,930 B2
(45) Date of Patent: Feb. 22, 2022

(54) HALL SENSOR TRIM CIRCUIT

(71) Applicant: TEXAS INSTRUMENTS INCORPORATED, Dallas, TX (US)

(72) Inventors: Junfeng Jiang, Plano, TX (US); Julio E. Acosta, Allen, TX (US); Srinivasan Venkataraman, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 16/934,207

(22) Filed: Jul. 21, 2020

(65) Prior Publication Data

US 2021/0041509 A1 Feb. 11, 2021

Related U.S. Application Data

(60) Provisional application No. 62/882,738, filed on Aug. 5, 2019.

(51) Int. Cl.
*G01R 33/07* (2006.01)

(52) U.S. Cl.
CPC ......... *G01R 33/072* (2013.01); *G01R 33/077* (2013.01)

(58) Field of Classification Search
CPC ........................... G01R 33/072; G01R 33/077
See application file for complete search history.

(56) References Cited

U.S. PATENT DOCUMENTS

| 10,578,681 | B2* | 3/2020 | Raghavan | .......... G01R 33/0041 |
| 2008/0088298 | A1* | 4/2008 | Haddab | .................. G01D 5/142 |
| | | | | 324/117 H |
| 2016/0313407 | A1* | 10/2016 | Towne | .................... G01R 33/07 |

* cited by examiner

*Primary Examiner* — Reena Aurora
(74) *Attorney, Agent, or Firm* — John R. Pessetto; Charles A. Brill; Frank D. Cimino

(57) ABSTRACT

A Hall sensor trim circuit includes a current source, a transistor, a reference voltage circuit, an amplifier, and a Hall sensor. The transistor includes a first terminal, a second terminal, and a third terminal. The third terminal is coupled to the current source. The amplifier includes an output terminal, a first input terminal, and a second input terminal. The output terminal is coupled to the first terminal of the transistor. The first input terminal is coupled to the second terminal of the transistor. The second input terminal is coupled to the reference voltage circuit. The Hall sensor is coupled to the current source.

20 Claims, 4 Drawing Sheets

HALL SENSOR TRIM CIRCUIT

CROSS-REFERENCE TO RELATED APPLICATION

This application claim priority to U.S. Provisional Application No. 62/882,738, filed Aug. 5, 2019, titled "Precision Hall Sensor Sensitivity Trim Circuit for Arbitrary Temperature Coefficient," which is hereby incorporated herein by reference in its entirety.

BACKGROUND

Hall sensors are used to measure magnetic field strength in a variety of applications. For example, Hall sensors may be used in proximity sensing, positioning, speed detection, and current sensing applications. A Hall sensor includes a Hall element that generates a voltage proportional to a magnetic field about the Hall element.

SUMMARY

Hall sensor trim circuits that use resistors and feedback amplifier to trim Hall sensor sensitivity are disclosed herein. A Hall sensor trim circuit with a wide trim range and high trim resolution is presented here. In one example, a Hall sensor trim circuit includes a current source, a transistor, a reference voltage circuit, an amplifier, and a Hall sensor. The transistor includes a first terminal, a second terminal, and a third terminal. The third terminal is coupled to the current source. The amplifier includes an output terminal, a first input terminal, and a second input terminal. The output terminal is coupled to the first terminal of the transistor. The first input terminal is coupled to the second terminal of the transistor. The second input terminal of the amplifier is coupled to the reference voltage circuit. The Hall sensor is coupled to the current source.

In another example, a Hall sensor trim circuit includes a current source, a reference voltage circuit, a voltage divider circuit, a transistor, and an amplifier. The Hall sensor is coupled to the current source. The transistor is configured to pass a current generated by the current source. The amplifier is coupled to the voltage divider circuit, the voltage reference circuit, and the transistor, and is configured to drive the transistor based on output of the voltage divider circuit, output of the reference voltage circuit, and feedback from the transistor.

In a further example, a method includes applying a magnetic field to a Hall sensor. A positive reference voltage and a negative reference voltage are set to a same voltage. The positive reference voltage and a negative reference voltage control a bias current to the Hall sensor. A most significant bit of a voltage divider control code is set, and the voltage divider control code is applied to an R-2R resistor network of a voltage divider circuit that controls the bias current to the Hall sensor. A first output of the Hall sensor is measured. The positive reference voltage and the negative reference voltage are set to different voltages. A second output of the Hall sensor is measured. The first output of the Hall sensor is compared to the second output of the Hall sensor. The voltage divider control code is adjusted to make the second output of the Hall sensor a same voltage as the first output of the Hall sensor.

BRIEF DESCRIPTION OF THE DRAWINGS

For a detailed description of various examples, reference will now be made to the accompanying drawings in which.

DETAILED DESCRIPTION

The temperature coefficient of the sensitivity of Hall sensors is generally difficult to trim. Some trim circuits apply proportional to absolute temperature (PTAT) and complementary to absolute temperature (CTAT) currents from a bandgap circuit or other biasing circuitry to trim the temperature coefficient of a Hall sensor circuit. Such trim circuitry may require substantial circuit area and provide limited trim range and resolution. Other systems use digital processing circuitry to control bias current based on measurements provided by a temperature sensor. Digital processing consumes substantial power and circuit area.

The Hall sensor trim circuits disclosed herein are independent of the Hall sensor biasing circuitry, provide wide trim range, and high trim resolution. The Hall temperature trim circuits of the present disclosure apply negative feedback to control Hall sensor bias current, and are therefore insensitive to variation of transistor parameters, and robust over time and changes in environmental conditions. The Hall sensor trim circuits have low power consumption, small circuit area, are immune to magnetic interference, and do not require a temperature sensor or digital signal processing.

Figure 1:
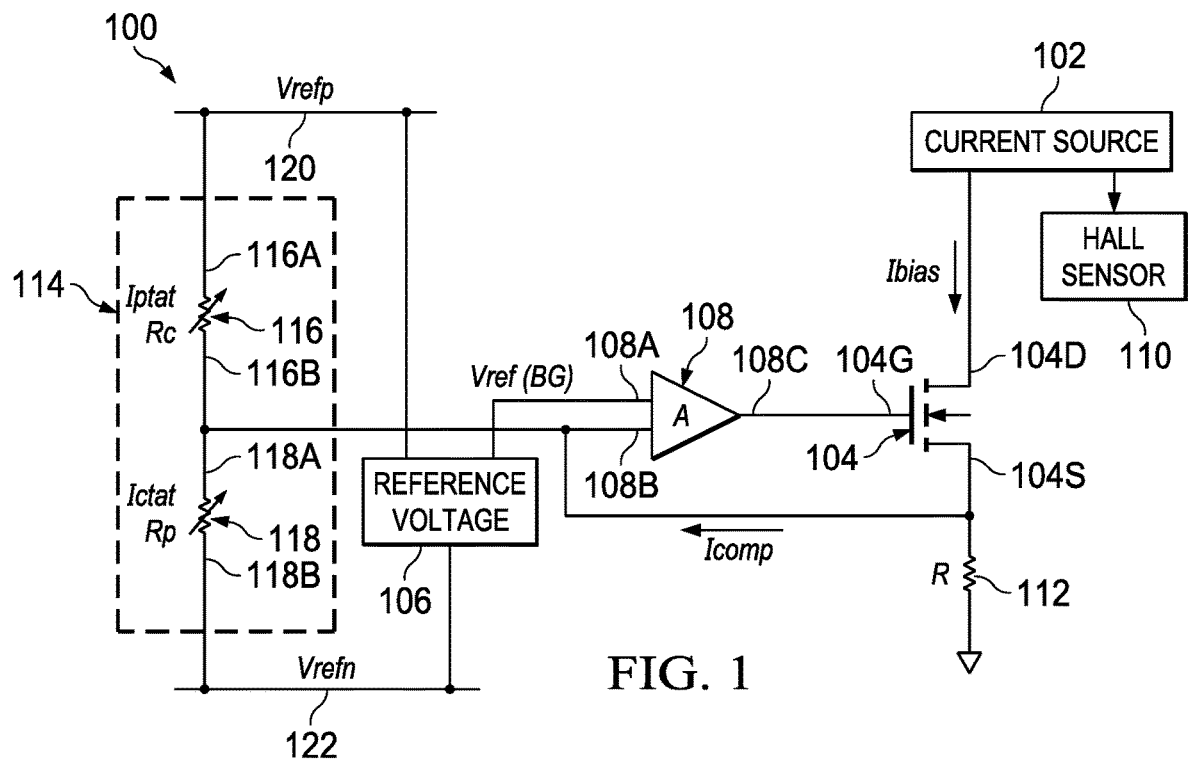
FIG. 1 shows a schematic level diagram for a first example Hall sensor trim circuit in accordance with this disclosure.

FIG. 1 shows a schematic level diagram for a first example Hall sensor trim circuit 100 in accordance with this disclosure. The Hall sensor trim circuit 100 includes a current source 102, a transistor 104, a reference voltage circuit 106, an amplifier 108, a Hall sensor 110, a resistor 112, and a voltage divider 114. The current source 102 is coupled to, and generates bias currents, for the transistor 104 and the Hall sensor 110. The transistor 104 is an N-channel metal oxide semiconductor field effect transistor (MOSFET) in some implementations of the Hall sensor trim circuit 100. The drain terminal 104D of the transistor 104 is coupled to the current source 102, and the source terminal 104S of the transistor 104 is coupled to the resistor 112. Bias current generated by the current source 102 flows through the transistor 104 and the resistor 112.

The transistor 104 is controlled by the amplifier 108. The gate terminal 104G of the transistor 104 is coupled to the output terminal 108C of the amplifier 108. An input terminal 108A (a non-inverting input terminal) is coupled to the reference voltage circuit 106, which generates a reference voltage for controlling the transistor 104. An input terminal 108B (an inverting input terminal) of the amplifier 108 is coupled the voltage divider 114 and the source terminal 104S of the transistor 104. The negative feedback provided by connection of the input terminal 108B of the amplifier 108 to the source terminal 104S of transistor 104 compensates for variation in the transistor 104 due to process, temperature, etc.

The voltage divider 114 includes a resistor 116 and a resistor 118. The resistor 116 is a fixed resistor or a variable resistor, and the resistor 118 is a variable resistor. The resistor 116 and the resistor 118 have different temperature coefficients. A terminal 116A of the resistor 116 is coupled to a voltage reference terminal 120 (a positive reference voltage terminal), and a terminal 116B of the resistor 116 is coupled the input terminal 108B of the amplifier 108. A terminal 118A of the resistor 118 is coupled to input terminal 108B of the amplifier 108, and a terminal 118 of the resistor 118 is coupled to a voltage reference terminal 122 (a negative reference voltage terminal).

The sensitivity of the Hall sensor 110 is proportional to the bias current generated by the current source 102. Well controlled bias current leads to well controlled sensitivity. In the Hall sensor trim circuit 100, bias current (Ibias) is generated as:

$$Ibias = Icomp + \frac{Vref}{R} \qquad (1)$$

where:
Icomp is feedback current from the source terminal 104S of the transistor 104;

$$Vref \text{ is } \frac{Vrefp + Vrefn}{2};$$

and
R is the resistance of the resistor 112.

Thus, in the Hall sensor trim circuit 100, bias current is generated from Vref/R with negative feedback. The current Icomp becomes non-zero when the resistance (Rc) of the resistor 116 and the resistance (Rp) of the resistor 118 are not equal. In the Hall sensor trim circuit 100, the resistance of the resistor 118 is adjusted to trim the temperature coefficient of the Hall sensor 110.

Figure 2:
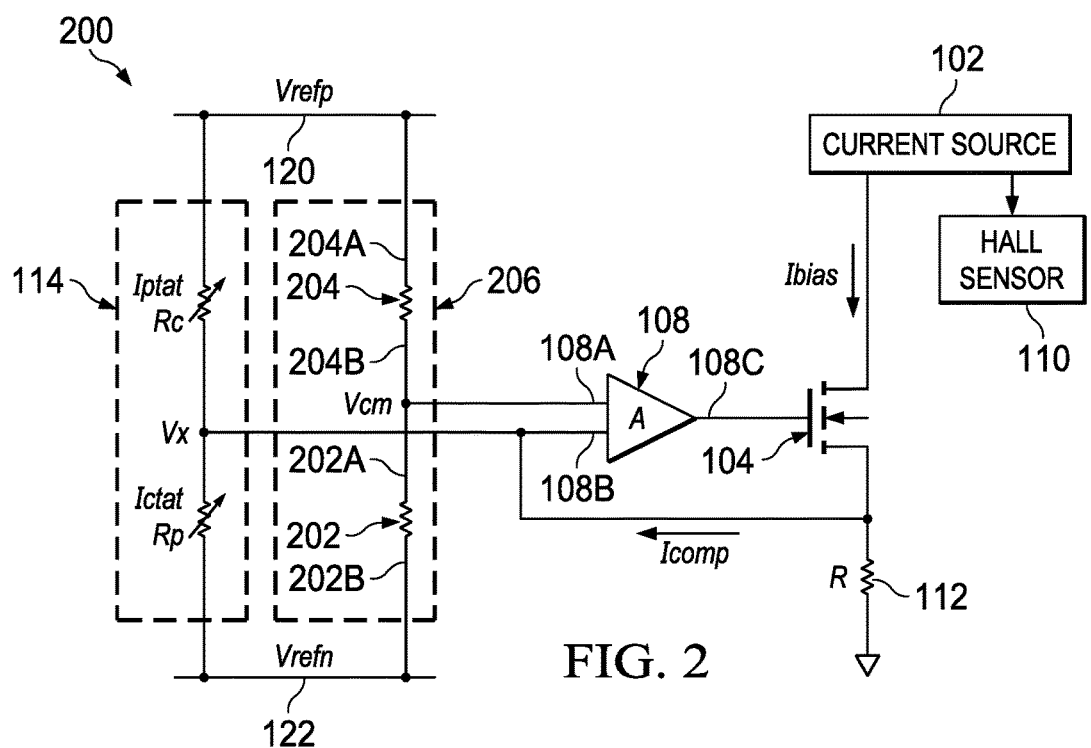
FIG. 2 shows a schematic level diagram for a second example Hall sensor trim circuit in accordance with this disclosure.

FIG. 2 shows a schematic level diagram for a second example Hall sensor trim circuit 200 in accordance with this disclosure. The Hall sensor trim circuit 200 is an implementation of the Hall sensor trim circuit 100. The reference voltage circuit 206 is an implementation of the reference voltage circuit 106, and includes a fixed resistor 202 and a fixed resistor 204 connected as a voltage divider. A terminal 204A of the resistor 204 is coupled to the voltage reference terminal 120, and a terminal 204B of the resistor 204 is coupled to the input terminal 108A of the amplifier 108. A terminal 202B of the resistor 202 is coupled to the voltage reference terminal 122, and a terminal 202A of the resistor 202 is coupled to the input terminal 108A of the amplifier 108. The reference voltage circuit 206 generates a reference voltage to provide to the input terminal 108A of the amplifier 108 as a common mode voltage (Vcm).

$$Vcm = \frac{Vrefp + Vrefn}{2} \qquad (2)$$

The feedback current (Icomp) is expressed as:

$$Icomp = \qquad (3)$$

-continued
$$\frac{Vrefp - Vx}{Rc} - \frac{Vx - Vrefn}{Rp} = \frac{2(Vcm - Vx)}{Rc} + (Vrefn - Vx)\left(\frac{1}{Rc} - \frac{1}{Rp}\right)$$

where:
Vx is voltage at the input terminal 108B of the amplifier 108; and $$\frac{2(Vcm - Vx)}{Rc}$$

is offset error of the amplifier 108.

Thus, the offset error of the amplifier 108 is independent of Vrefp and Vrefn at room temperature (e.g., 20-25 degrees Celsius (° C.)). For Rc=Rp, Icomp is independent of Vrefn. Therefore, after Rc and/or Rp is adjusted (at room temperature) to make Rc=Rp, Vrefp and/or Vrefn are adjusted (at hot temperature) to achieve a desired temperature coefficient.

Figure 3:
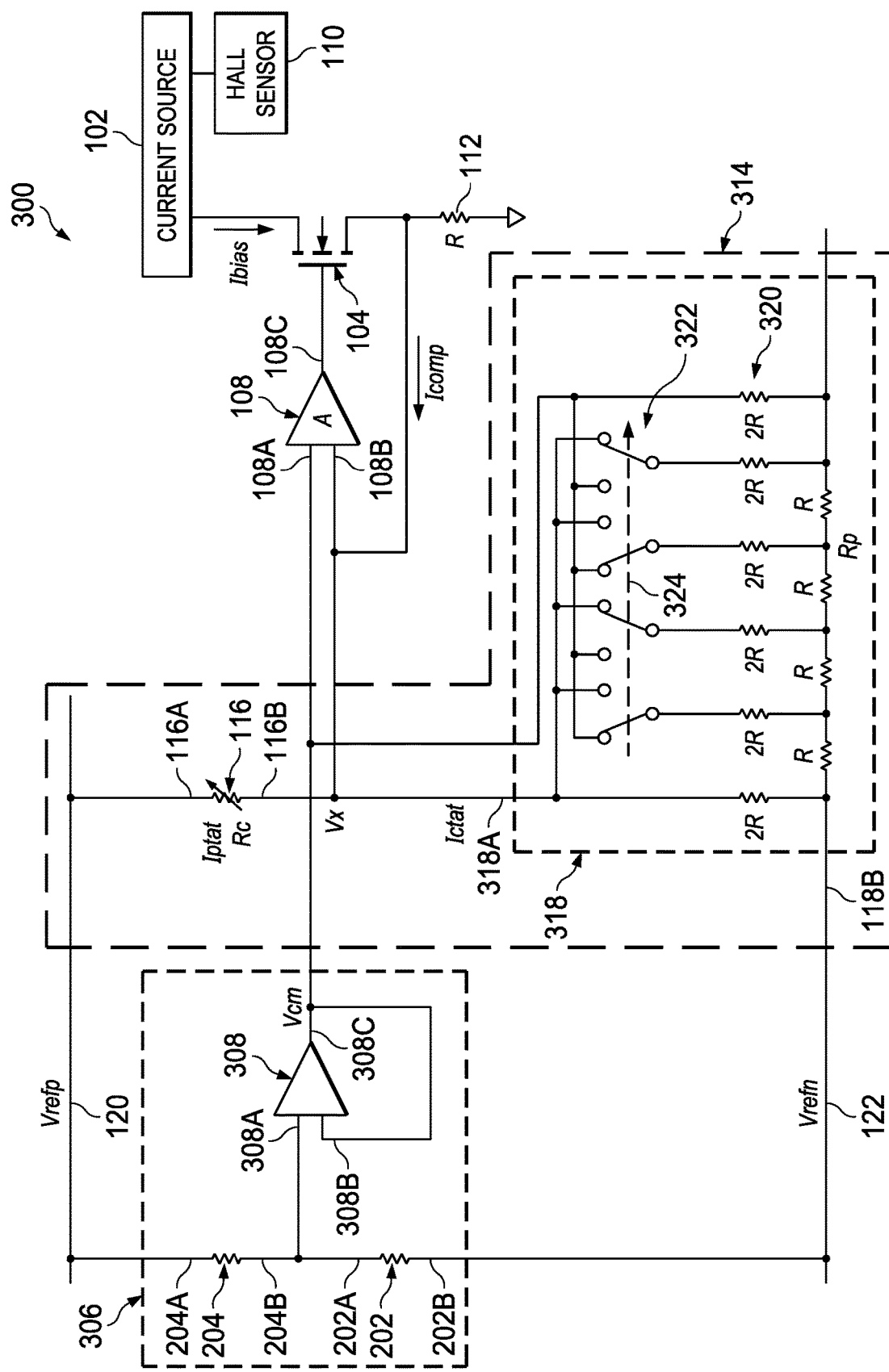
FIG. 3 shows a schematic level diagram for a third example Hall sensor trim circuit in accordance with this disclosure.

FIG. 3 shows a schematic level diagram for a third example Hall sensor trim circuit 300 in accordance with this disclosure. The Hall sensor trim circuit 300 is an implementation of the Hall sensor trim circuit 200. In the Hall sensor trim circuit 300, the reference voltage circuit 306 is an implementation of the reference voltage circuit 206, and the voltage divider 314 is an implementation of the voltage divider 114. The reference voltage circuit 306 includes an amplifier 308 that buffers the common mode voltage produced by the resistors 202 and 204. The amplifier 308 is configured as a voltage follower, and includes an input terminal 308A (non-inverting input terminal) coupled to the terminal 204B of the resistor 204 and the terminal 202A of the resistor 202, and an output terminal 308C coupled to the input terminal 108A of the amplifier 108 and the input terminal 308B (inverting input terminal) of the amplifier 308.

The voltage divider 314 includes the resistor 116 and a digital-to-analog converter (DAC) 318 coupled to the resistor 116. The DAC 318 is an implementation of the resistor 118. The DAC 318 includes a resistor ladder 320 (e.g., an R-2R resistor ladder network) and switches 322. A terminal 318A of the DAC 318 is coupled to the output terminal 308C of the amplifier 308. The switches 322 couple the resistor ladder 320 to the input terminal 108B of the amplifier 108 and the output terminal 308C of the amplifier 308 under control of a control code 324. Thus, the resistance of the DAC 318 between the input terminal 108B of the amplifier 108 and the voltage reference terminal 122 varies based on the control code 324.

In the Hall sensor trim circuit 300, the resistance of the DAC 318 is adjusted, via the control code 324, at room temperature to make the resistance of the resistor 116 and the resistance of the DAC 318 equal. In some implementations of the Hall sensor trim circuit 300, the resistor 116 is implemented as a DAC, and adjusted, at room temperature, to make the resistance of the resistor 116 equal to the resistance of the DAC 318.

Figure 4:
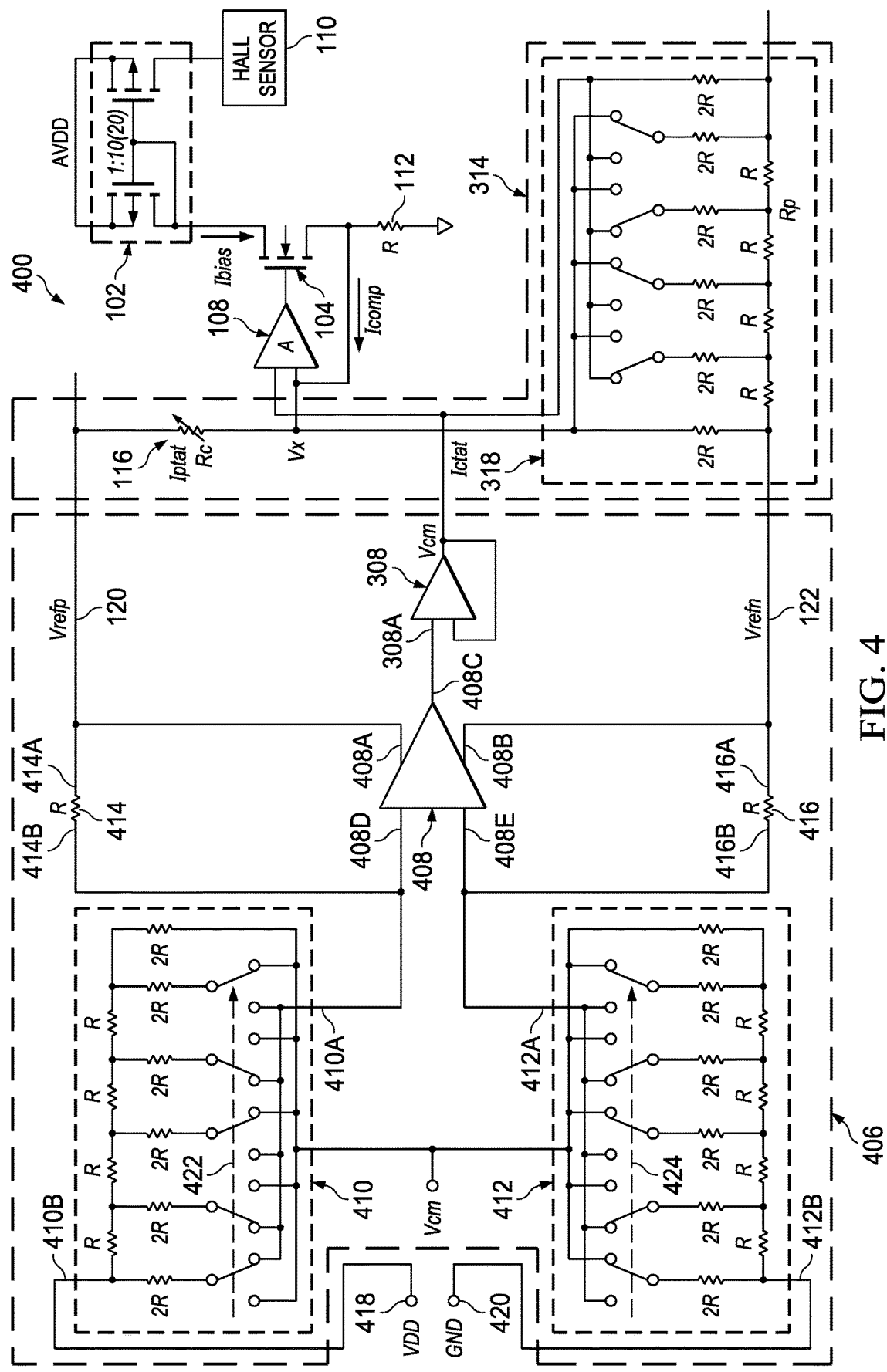
FIG. 4 shows a schematic level diagram for a fourth example Hall sensor trim circuit in accordance with this disclosure.

FIG. 4 shows a schematic level diagram for a fourth example Hall sensor trim circuit 400 in accordance with this disclosure. The Hall sensor trim circuit 400 is an implementation of the Hall sensor trim circuit 300. In the Hall sensor trim circuit 400, the reference voltage circuit 406 is an implementation of the reference voltage circuit 306. The reference voltage circuit 406 generates the reference voltages Vrefp, Vrefn, and the common mode voltage Vcm. The reference voltage circuit 406 includes an amplifier 408 (a differential amplifier), a DAC 410, and a DAC 412. The DACs 410 and 412 are variable resistors that are used to trim the temperature coefficient of the Hall sensor 110. The resistance of the DAC 410 is set by a control code 422, and the resistance of the DAC 412 is set by a control code 424.

The amplifier 408 includes an output terminal 408A coupled to the voltage reference terminal 120, an output terminal 408B coupled to the voltage reference terminal 122, and an output terminal 408C coupled to the input terminal 308A of the amplifier 308. An input terminal 408D (non-inverting input terminal) of the amplifier 408 is coupled to the output terminal 408A of the amplifier 408 via the resistor 414. The resistor 414 includes a terminal 414A coupled to the output terminal 408A of the amplifier 408, and a terminal 414B coupled to the input terminal 408D of the amplifier 408. An input terminal 408E (inverting input terminal) of the amplifier 408 is coupled to the output terminal 408B of the amplifier 408 via the resistor 416. The resistor 416 includes a terminal 416A coupled to the output terminal 408B of the amplifier 408, and a terminal 416B coupled to the input terminal 408E of the amplifier 408. An output terminal 410A of the DAC 410 is coupled to the input terminal 408D of the amplifier 408, and in input terminal 410B of the DAC 410 is coupled to a power supply terminal 418. An output terminal 412A of the DAC 412 is coupled to the input terminal 408E of the amplifier 408, and an input terminal 412B of the DAC 412 is coupled to a ground terminal 420.

In the Hall sensor trim circuit 400, the resistance of the DAC 410 and/or the DAC 412 is adjusted, via the control code 422 and/or the control code 424, at hot temperature (e.g., 55-125° C.) to adjust the reference voltages and trim the temperature coefficient of the Hall sensor 110. With room temperature trim via the DAC 318, Icomp is independent of the reference voltages at room temperature. Because the reference voltages can swing to the full power supply voltages, Icomp can change over a wide range. That is, the Hall sensor trim circuit 400 provides a wide trim range.

Figure 5:
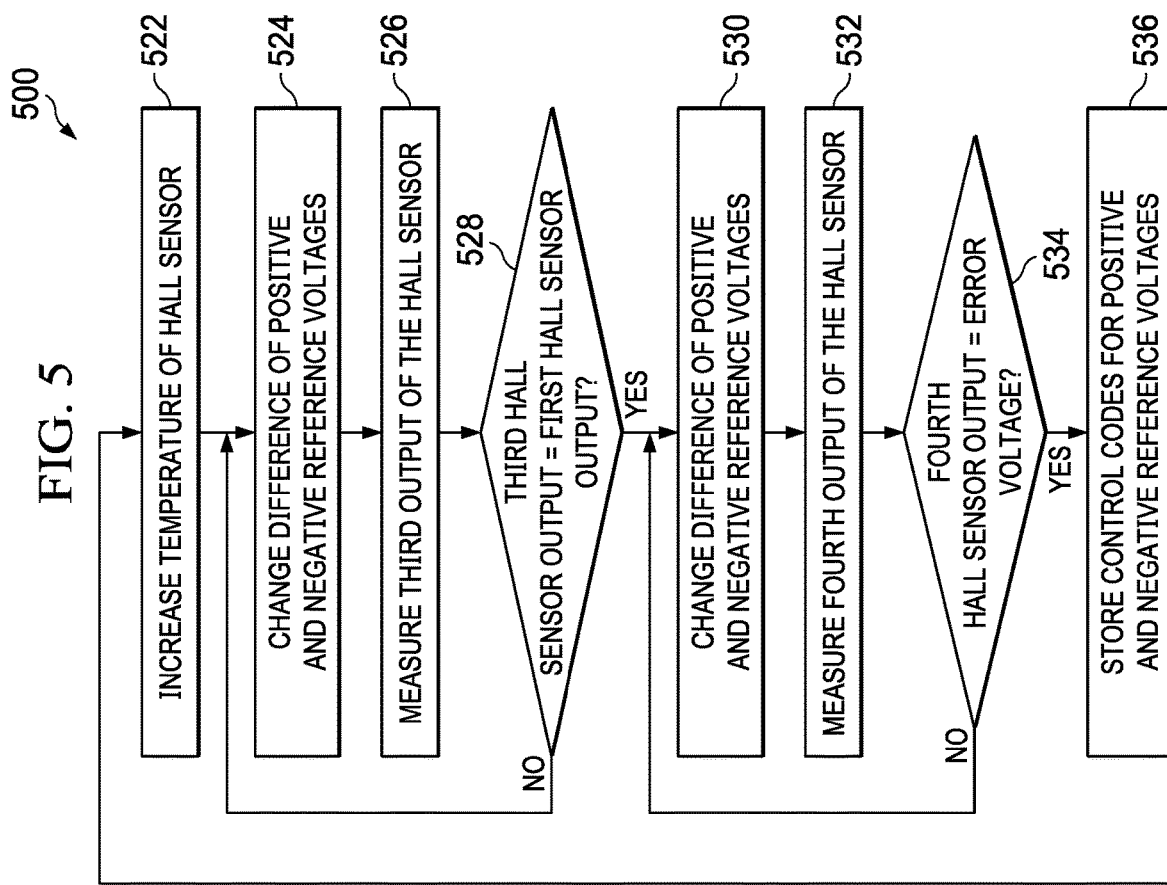
FIG. 5 shows a flow diagram for an example method for trimming a Hall sensor in accordance with this disclosure.
Figure 5:
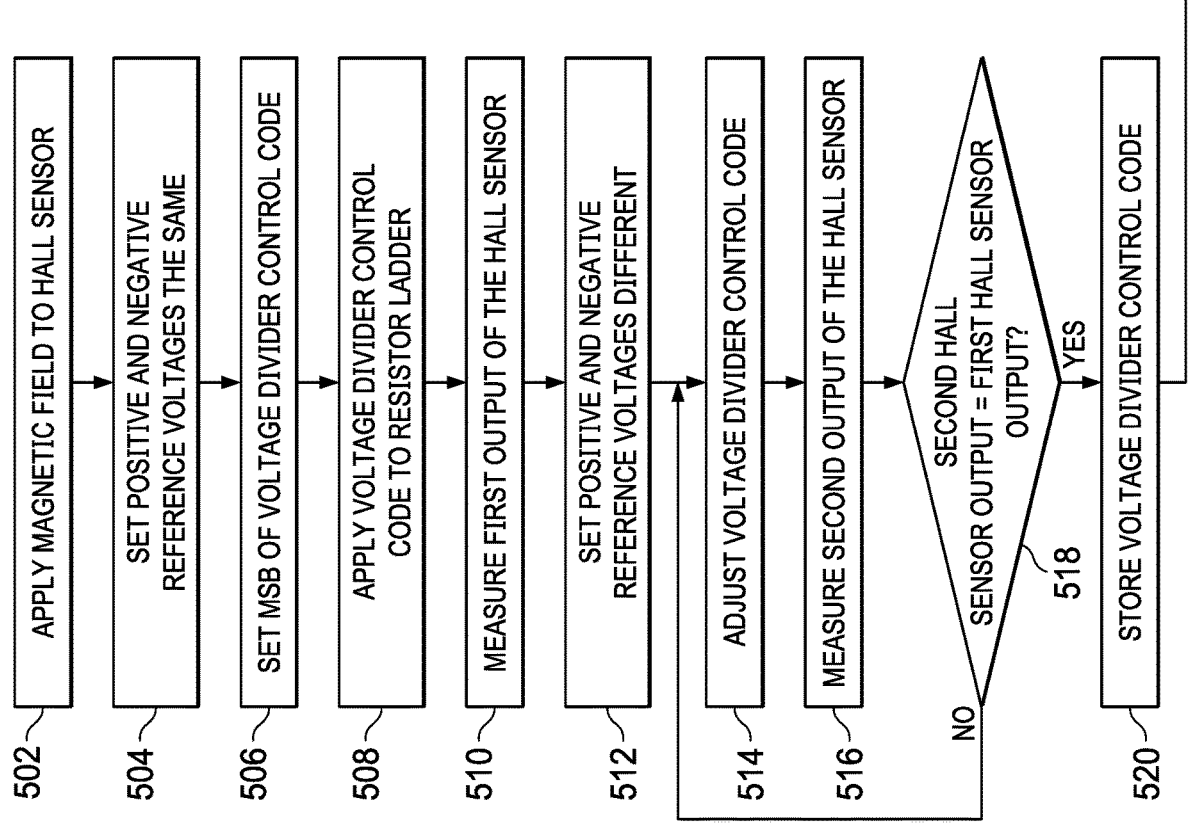

FIG. 5 shows a flow diagram for an example method 500 for trimming a Hall sensor in accordance with this disclosure. Though depicted sequentially as a matter of convenience, at least some of the actions shown can be performed in a different order and/or performed in parallel. Additionally, some implementations may perform only some of the actions shown. Operations of the method 500 may be performed using the Hall sensor trim circuit 100, Hall sensor trim circuit 200, Hall sensor trim circuit 300, or Hall sensor trim circuit 400 to trim temperature coefficient.

In block 502, the Hall sensor trim circuit 400 is at room temperature, and a stable magnetic field is applied to the Hall sensor 110 of the Hall sensor trim circuit 400.

In block 504, the positive reference voltage (Vrefp) and the negative reference voltage (Vrefn) are set to a same voltage value. For example, the 422 and the 424 respectively applied to the 410 and the 412 may be set to a value of '0' to set the positive reference voltage (Vrefp) and the negative reference voltage (Vrefn) to the common mode voltage (Vcm).

In block 506, the most significant bit (MSB) of the control code 324 is set, and the other bits of the control code 324 are reset.

In block 508, the control code 324 is applied to the DAC 318.

In block 510, the output of the Hall sensor 110 is measured.

In block 512, positive reference voltage (Vrefp) and negative reference voltage (Vrefn) are set to different voltage values. For example, the positive and negative reference voltages may be set such that Vrefp-Vrefn equals one-half the power supply voltage. Vrefp and Vrefn are set by providing suitable values of the control codes 422 and 424 to the DAC 410 and the DAC 412.

In block 514, the control code 324 is adjusted and applied to the DAC 318.

In block 516, the output of the Hall sensor 110 is measured.

In block 518, the output of the Hall sensor 110 measured in block 516 is compared to the output of the Hall sensor 110 measured in block 510. If the output of the Hall sensor 110 measured in block 516 is not equal to the output of the Hall sensor 110 measured in block 510, then the control code 324 is adjusted in block 514.

If the output of the Hall sensor 110 measured in block 516 is equal to the output of the Hall sensor 110 measured in block 510, then, in block 520, the control code 324 is stored in non-volatile memory as a final value of the control code 324 for use in operation of the Hall sensor trim circuit 400.

In block 522, the temperature of the Hall sensor trim circuit 400 is increased for hot trim and the magnetic field applied to the Hall sensor 110 is stable. The control code 324 stored in block 520 is applied to the DAC 318

In block 524, the difference in the positive reference voltage (Vrefp) and the negative reference voltage (Vrefn) is changed by adjusting the control code 422 and/or the control code 424.

In block 526, the output of the Hall sensor 110 is measured.

In block 528, the output of the Hall sensor 110 measured in block 526 is compared to the output of the Hall sensor 110 measured in block 510. If the output of the Hall sensor 110 measured in block 524 is not equal to the output of the Hall sensor 110 measured in block 510, then the control code 422 and/or the control code 424 are adjusted in block 524.

If the output of the Hall sensor 110 measured in block 524 is equal to the output of the Hall sensor 110 measured in block 510, then the control code 422 and/or the control code 424 are adjusted in block 530.

In block 532, the output of the Hall sensor 110 is measured.

In block 534, the output of the Hall sensor 110 measured in block 532 is compared to a predetermined error voltage (Y) for which:

$$\frac{Y-X}{X(T_{hot}-T_{room})}*10^6 \text{ ppm/° C.} \quad (4)$$

where:
X is the measured output of the Hall sensor 110 in block 510;
Y is the measured output of the Hall sensor 110 in block 526, and corresponds to a predetermined change in output of the Hall sensor 110 over temperature;
Thot is the temperature of the Hall sensor 110 in block 526; and
Troom is the temperature of the Hall sensor 110 in block 510.

If the output of the Hall sensor 110 measured in block 532 is not equal to Yas per expression (4), then the control code 422 and/or the control code 424 are adjusted in block 530.

If the output of the Hall sensor 110 measured in block 532 is equal Yas per expression (4), then the control code 422 and/or the control code 424 are stored in non-volatile memory for use in operation of the Hall sensor trim circuit 400.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A Hall sensor trim circuit, comprising:
   a current source;
   a transistor comprising:
      a first terminal;
      a second terminal; and
      a third terminal coupled to the current source;
   a reference voltage circuit;
   an amplifier, comprising:
      an output terminal coupled to the first terminal of the transistor;
      a first input terminal coupled to the second terminal of the transistor; and
      a second input terminal coupled to the reference voltage circuit; and
   a Hall sensor coupled to the current source.

2. The Hall sensor trim circuit of claim 1, wherein:
   the reference voltage circuit comprises:
      a first reference voltage terminal; and
      a second reference voltage terminal; and
   the Hall sensor trim circuit further comprises:
      a first resistor comprising:
         a first terminal coupled to the first reference voltage terminal; and
         a second terminal coupled to the first input terminal of the amplifier; and
      a second resistor comprising:
         a first terminal coupled to the second reference voltage terminal; and
         a second terminal coupled to the first input terminal of the amplifier.

3. The Hall sensor trim circuit of claim 2, wherein:
   the first resistor is a fixed resistor; and
   the second resistor is a variable resistor.

4. The Hall sensor trim circuit of claim 3, wherein the variable resistor comprises an R-2R resistor ladder network.

5. The Hall sensor trim circuit of claim 1, wherein the reference voltage circuit comprises:
   a first reference voltage terminal;
   a second reference voltage terminal;
   a first resistor comprising:
      a first terminal coupled to the first reference voltage terminal; and
      a second terminal coupled to the second input terminal of the amplifier; and
   a second resistor comprising:
      a first terminal coupled to the second reference voltage terminal; and
      a second terminal coupled to the second input terminal of the amplifier.

6. The Hall sensor trim circuit of claim 5, wherein:
   the amplifier is a first amplifier; and
   the Hall sensor trim circuit comprises:
      a second amplifier comprising:
         an input terminal coupled to the second terminal of the first resistor and the second terminal of the second resistor; and
         an output terminal coupled to the second input terminal of the first amplifier.

7. The Hall sensor trim circuit of claim 5, wherein:
   the amplifier is a first amplifier; and
   the reference voltage circuit comprises:
      a second amplifier comprising:
         a first output terminal coupled to the first reference voltage terminal;
         a second output terminal coupled to the second reference voltage terminal; and
         a third output terminal coupled to the second input terminal of the first amplifier.

8. The Hall sensor trim circuit of claim 7, wherein:
   the second amplifier comprises:
      a first input terminal; and
      a second input terminal; and
   the reference voltage circuit comprises:
      a first variable resistor comprising:
         a first terminal coupled to a power supply terminal; and
         a second terminal coupled to the first input terminal of the second amplifier;
      a second variable resistor comprising:
         a first terminal coupled to a ground terminal; and
         a second terminal coupled to the second input terminal of the second amplifier;
      a first fixed resistor comprising:
         a first terminal coupled to the first output terminal of the second amplifier; and
         a second terminal coupled to the first input terminal of the second amplifier;
      a second fixed resistor comprising:
         a first terminal coupled to the second output terminal of the second amplifier; and
         a second terminal coupled to the second input terminal of the second amplifier.

9. A Hall sensor trim circuit, comprising:
   a current source;
   a Hall sensor coupled to the current source;
   a reference voltage circuit;
   a voltage divider circuit;
   a transistor configured to pass a bias current generated by the current source; and
   an amplifier coupled to the voltage divider circuit, the voltage reference circuit, and the transistor, and configured to drive the transistor based on output of the voltage divider circuit, output of the reference voltage circuit, and feedback from the transistor.

10. The Hall sensor trim circuit of claim 9, wherein the voltage divider circuit comprises:
    a first resistor with a first temperature coefficient; and
    a second resistor with a second temperature coefficient;
    wherein the first temperature coefficient is different from the second temperature coefficient.

11. The Hall sensor trim circuit of claim 10, wherein:
    the first resistor is a fixed resistor; and
    the second resistor is a variable resistor.

12. The Hall sensor trim circuit of claim 11, wherein the variable resistor comprises a digital-to-analog converter.

13. The Hall sensor trim circuit of claim 9, wherein the voltage reference circuit comprises a first fixed resistor and a second fixed resistor configured as a voltage divider.

14. The Hall sensor trim circuit of claim 9, wherein:
the amplifier is a first amplifier; and
the voltage reference circuit comprises a second amplifier configured to buffer output of the voltage divider circuit to the first amplifier.

15. The Hall sensor trim circuit of claim 9, wherein:
the amplifier is a first amplifier; and
the voltage reference circuit comprises:
   a second amplifier configured to:
      generate a positive reference voltage for application to the voltage divider circuit;
      generate a negative reference voltage for application to the voltage divider circuit; and
      generate a common mode voltage for input to the first amplifier.

16. The Hall sensor trim circuit of claim 15, wherein:
the second amplifier comprises:
   a non-inverting input terminal; and
   an inverting input terminal; and
the voltage reference circuit comprises:
   a first variable resistor configured to drive the non-inverting input terminal; and
   a second variable resistor configured to drive the inverting input terminal.

17. A method, comprising:
applying a magnetic field to a Hall sensor;
setting a positive reference voltage and a negative reference voltage to a same voltage; wherein the positive reference voltage and the negative reference voltage control a bias current to the Hall sensor;
setting a most significant bit of a voltage divider control code;
applying the voltage divider control code to an analog-to-digital converter of a voltage divider circuit that controls the bias current to the Hall sensor;
measuring a first output of the Hall sensor;
setting the positive reference voltage and the negative reference voltage to different voltages;
measuring a second output of the Hall sensor;
comparing the first output of the Hall sensor to the second output of the Hall sensor; and
adjusting the voltage divider control code to make the second output of the Hall sensor a same voltage as the first output of the Hall sensor.

18. The method of claim 17, further comprising storing a value of the voltage divider control code that makes the second output of the Hall sensor the same voltage as the first output of the Hall sensor as a final value of the voltage divider control code.

19. The method of claim 17, further comprising;
increasing a temperature of the Hall sensor; and
changing a difference of the positive reference voltage and the negative reference voltage to make a third output of the Hall sensor the same voltage as the first output of the Hall sensor.

20. The method of claim 19, further comprising changing a difference of the positive reference voltage and the negative reference voltage to make a fourth output of the Hall sensor a predetermined voltage, wherein the predetermined voltage corresponds to a predetermined change in output of the Hall sensor over temperature.

* * * * *